(12) United States Patent
Gentile et al.

(10) Patent No.: US 11,497,135 B2
(45) Date of Patent: Nov. 8, 2022

(54) COOLING APPARATUS COMPRISING A CONNECTING ELEMENT FOR SUPPORTING TUBES OR WIRES OR THE LIKE

(71) Applicant: Electrolux Appliances Aktiebolag, Stockholm (SE)

(72) Inventors: Marco Gentile, Porcia (IT); Federico Baldo, Porcia (IT); Sergio Grotto, Porcia (IT)

(73) Assignee: Electrolux Appliances Aktiebolag

( * ) Notice: Subject to any disclaimer, the term of this patent is extended or adjusted under 35 U.S.C. 154(b) by 318 days.

(21) Appl. No.: 16/633,915

(22) PCT Filed: Jul. 26, 2017

(86) PCT No.: PCT/EP2017/068827
§ 371 (c)(1),
(2) Date: Jan. 24, 2020

(87) PCT Pub. No.: WO2019/020176
PCT Pub. Date: Jan. 31, 2019

(65) Prior Publication Data
US 2021/0092865 A1  Mar. 25, 2021

(51) Int. Cl.
*H05K 7/20* (2006.01)
*F25D 23/08* (2006.01)
*H02G 3/04* (2006.01)

(52) U.S. Cl.
CPC .............. *H05K 7/20* (2013.01); *F25D 23/08* (2013.01); *H02G 3/0456* (2013.01)

(58) Field of Classification Search
None
See application file for complete search history.

(56) References Cited

U.S. PATENT DOCUMENTS 2,795,035 A   6/1957   Kafer
2,819,858 A   1/1958   Mittendorf
(Continued)

FOREIGN PATENT DOCUMENTS

CN    1490546 A      4/2004
CN    201680066 U   12/2010
(Continued)

OTHER PUBLICATIONS

International Search Report and Written Opinion for International Application No. PCT/EP2017/068827, dated Apr. 13, 2018, 10 pages.
(Continued)

*Primary Examiner* — Courtney L Smith
(74) *Attorney, Agent, or Firm* — RatnerPrestia

(57) ABSTRACT

A cooling apparatus having a compartment for storing products to be cooled and one or more tubes and/or wires connected to the compartment. A connecting element secures the tubes/wires to a compartment wall. The connecting element has a base portion configured to connect to the compartment wall and a supporting portion for supporting the tubes/wires. The supporting portion has first and second arms protruding from the base portion and defining a seat configured to receive the tubes/wires. The supporting portion has at least one elastic traverse member protruding from the first arm and/or the second arm towards the receiving seat. The elastic traverse member is configured to contact the tubes/wires that are inserted into the seat and secure the tubes/wires into the seat.

14 Claims, 10 Drawing Sheets

(56) References Cited

U.S. PATENT DOCUMENTS

| | | | |
|---|---|---|---|
| 2,918,712 | A | 12/1959 | Fernberg |
| 3,258,039 | A | 6/1966 | Ewalt |
| 3,835,660 | A | 9/1974 | Franck |
| 3,839,777 | A | 10/1974 | Puzio |
| 3,904,721 | A | 9/1975 | Puterbaugh |
| 4,072,374 | A | 2/1978 | True, Jr. |
| 4,332,429 | A | 6/1982 | Frick et al. |
| 4,416,503 | A | 11/1983 | Hayes |
| 4,470,179 | A | 9/1984 | Gollin et al. |
| 4,566,660 | A * | 1/1986 | Anscher ............ F16L 3/13 |
| | | | 24/453 |
| 4,711,025 | A | 12/1987 | DeSanto |
| 4,762,296 | A | 8/1988 | Kraus et al. |
| 4,917,340 | A | 4/1990 | Jüemann et al. |
| 5,107,688 | A | 4/1992 | Johnson |
| 5,401,010 | A | 3/1995 | Haswell et al. |
| 5,460,342 | A * | 10/1995 | Dore ............ F16L 3/223 |
| | | | 248/68.1 |
| D366,606 | S | 1/1996 | Nakamura |
| 5,947,426 | A | 9/1999 | Kraus |
| 6,216,986 | B1 | 4/2001 | Kwilosz |
| 6,446,916 | B2 * | 9/2002 | Takeda ............ F16B 7/0433 |
| | | | 248/74.1 |
| 6,883,762 | B2 * | 4/2005 | Miura ............ F16L 3/223 |
| | | | 248/62 |
| D631,739 | S | 2/2011 | Craig et al. |
| 8,051,673 | B2 | 11/2011 | Spiller |
| D679,177 | S | 4/2013 | Craig et al. |
| 8,668,174 | B2 | 3/2014 | Kato |
| 9,016,639 | B2 | 4/2015 | Kuhm et al. |
| 9,270,100 | B2 * | 2/2016 | Kuhm ............ F16L 3/085 |
| 9,494,258 | B2 * | 11/2016 | Flynn ............ F16L 3/237 |
| 9,599,391 | B2 | 3/2017 | Gultekin et al. |
| 9,669,778 | B2 * | 6/2017 | Satou ............ B60R 13/0275 |
| 10,638,632 | B2 * | 4/2020 | Park ............ H05K 7/1427 |
| 11,058,028 | B2 * | 7/2021 | Winkel ............ H05K 7/20727 |
| 2008/0217488 | A1 * | 9/2008 | Carretero ............ F16L 3/13 |
| | | | 248/65 |
| 2018/0111442 | A1 * | 4/2018 | Durkin ............ B62D 25/12 |
| 2020/0309426 | A1 | 10/2020 | Lim et al. |

FOREIGN PATENT DOCUMENTS

| | | |
|---|---|---|
| CN | 102943930 A | 2/2013 |
| CN | 202946767 U | 5/2013 |
| CN | 203532975 U | 4/2014 |
| CN | 204267885 U | 4/2015 |
| DE | 19859985 A1 | 6/2000 |
| DE | 102005057157 A1 | 5/2007 |
| DE | 202008007363 U1 | 8/2008 |
| DE | 102012012574 A1 | 10/2013 |
| DE | 102012222845 A1 | 6/2014 |
| EP | 0758728 A1 | 2/1997 |
| JP | 2003075057 A | 3/2003 |
| WO | 2009019268 A2 | 2/2009 |

OTHER PUBLICATIONS

Chinese Office Action for Chinese Application No. 201780093380.X, dated Nov. 26, 2020, 9 pages.

* cited by examiner

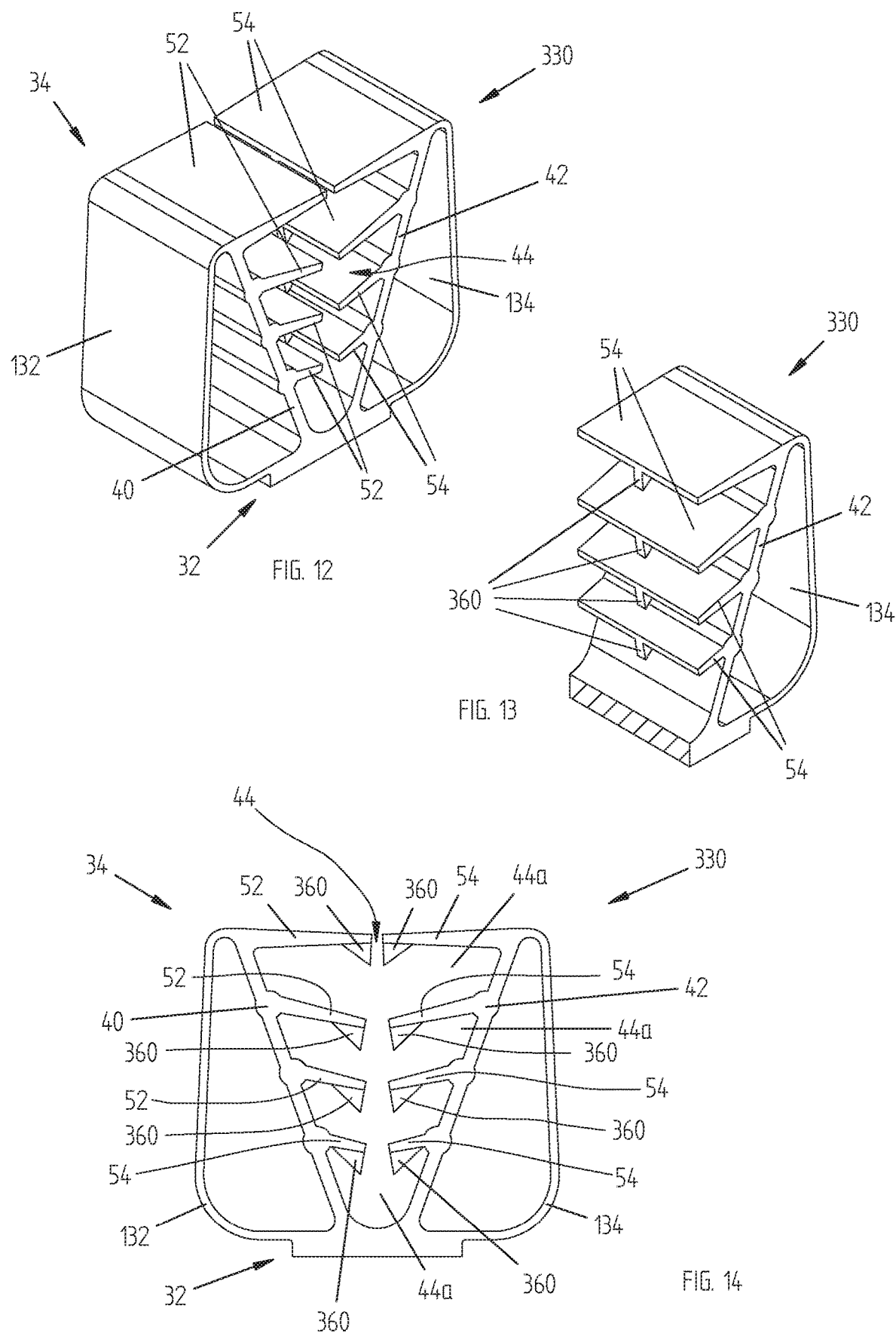

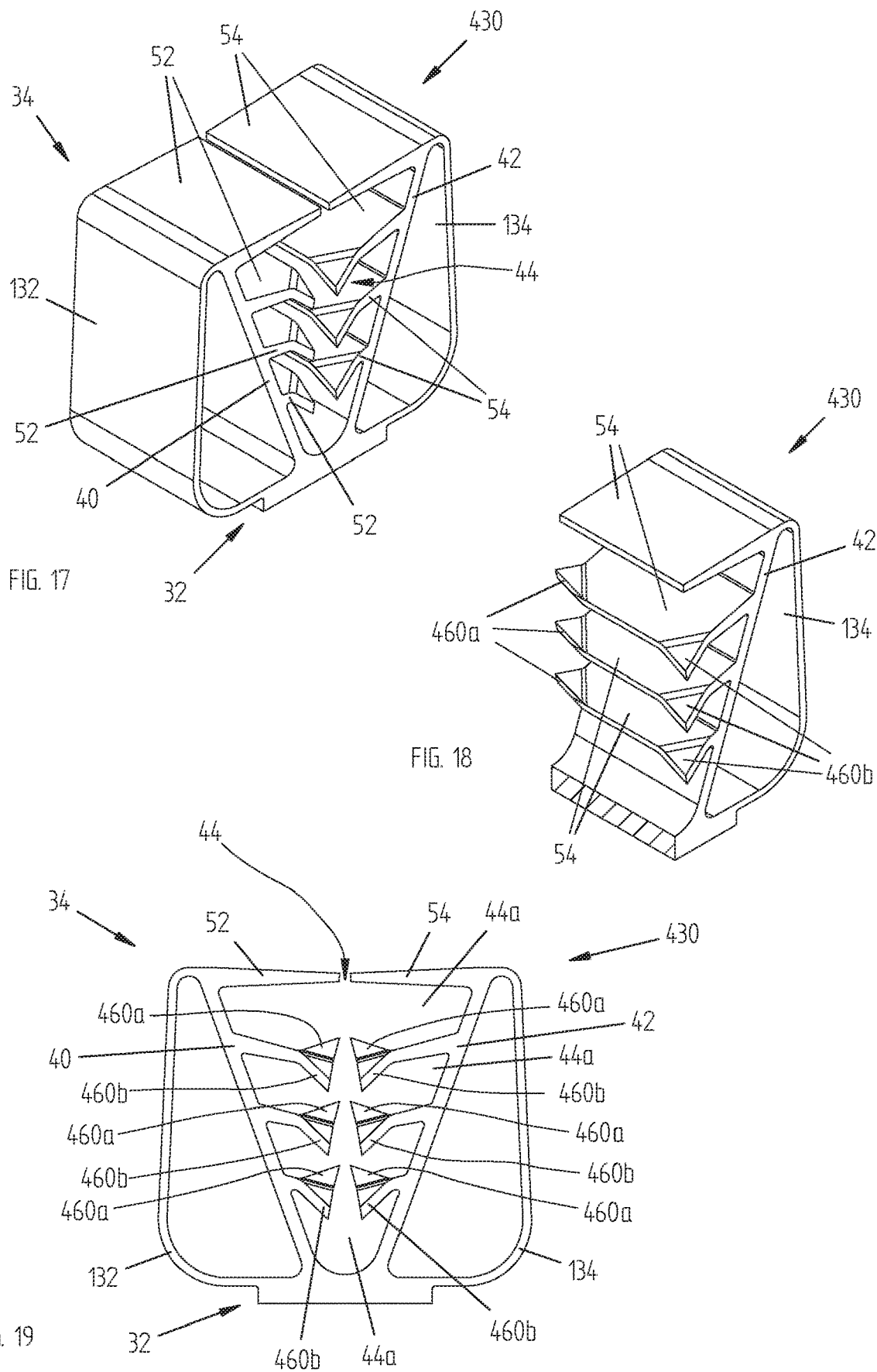

COOLING APPARATUS COMPRISING A CONNECTING ELEMENT FOR SUPPORTING TUBES OR WIRES OR THE LIKE

The present invention generally relates to cooling apparatuses, particularly for food and beverage storage, such as refrigerators and/or freezers for e.g. domestic use.

More specifically, the present invention relates to a connecting element for supporting tubes or wires in a cooling apparatus.

BACKGROUND ART

Refrigerators for foods and beverages generally comprise a cabinet, or outer casing, which houses at least one refrigerator compartment for storing the articles to be kept cool, like for example vegetables, fruit, dairy products, meat, beverages in bottles or cans. The refrigerator compartment is open frontally, or at the top, and a door enables access to the interior of the compartment.

Typically, the outer casing houses both a refrigerator compartment and a freezer compartment.

The refrigerator/freezer compartment is typically realized with a substantially box-like container, also known as inner liner, preferably made of a polymeric plastic material, such as PS (polystyrene).

The space defined between outer casing and inner liner is further apt to receive further components of the refrigerator.

Associated with the cabinet is a cooling system operable to keep cold the interior of the compartment. The cooling system typically comprises a compressor, a condenser and one or more evaporators; the compressor, condenser and evaporators are in fluid communication by means of a piping and altogether form a closed hydraulic circuit, which is circulated through by a cooling agent.

The evaporators are preferably constituted by tubes made of a material having good thermal conductivity (such as aluminium or copper). The tubes are opportunely shaped to interact with the respective compartment to cool or freeze the same.

In some known solutions, the tube forming the evaporator externally wraps the walls defining the compartment or, in some further embodiments, the tube forming the evaporator is placed closed to, or connected to, a surface of said walls.

A prior method of securing or otherwise maintaining the tubes and walls in a desired relationship, comprises the use of adhesive materials disposed between the tube and the compartment walls, such as shown in U.S. Pat. No. 2,795,035.

Another approach is disclosed in WO2009019268 that foresees the use of a connecting element connected to a compartment wall and supporting the tube.

In known refrigerators, furthermore, the space defined between outer casing and inner liner is preferably filled with an insulating material, for example a polyurethane foam, which enhances thermal insulation of the compartment. The insulating material is typically injected in the space after the components, such as the evaporators, have been arranged at their desired position.

Other components rather than evaporators that need to be connected to the compartment may comprise electrical wires, for example electrical wires that supply voltage to a lamp inside the compartment or electrical wires in general for electrical components to be powered, for example the compressor, a control unit, a thermostat, etc.

The connecting element disclosed in WO2009019268 is opportunely shaped to receive both a tube of the cooling system and an electrical wire to supply power to a control unit. The connecting element disclosed therein comprises a first seat constituted of a ring having a slit, i.e. C-shaped, for insertion of the tube, wherein the ring has a diameter that matches the outer diameter of the tube. The connecting element further comprises a second seat constituted of an elastic tongue defining an aperture for insertion of the electrical wire.

The C-shaped element and the elastic tongue are integrally made with a support shaft that extends from a bottom plate attachable to the compartment.

The connecting element with two seats according to the known technique, nevertheless, revealed some drawbacks.

A drawback posed by the connecting elements of the known art is the need to use different models/types of connecting elements according to the size/diameter of the tube/wire to be supported. Tubes or wires with different sizes necessitate of connecting elements ad hoc, with seats having dimensions matching said sizes. This negatively affects manufacturing costs of the refrigerator.

Another drawback posed by the connecting element with two seats of the known art lies in that it is cumbersome.

The main object of the present invention is therefore to overcome said drawbacks.

It is an object of the invention to provide a cooling apparatus with reduced complexity, and therefore easier to assemble, compared to cooling apparatuses of known type.

It is another object of the invention to provide a cooling apparatus cheaper compared to known system.

DISCLOSURE OF INVENTION

Applicant has found that by providing a cooling apparatus equipped with a compartment for the storage of products to be cooled and a connecting element for securing tubes and/or wires to a wall of said compartment, wherein the connecting element comprises a first arm and a second arm defining a seat apt to receive said tubes and/or wires and by providing at least one traverse member protruding from the first arm and/or the second arm towards said receiving seat, it is possible to reach the mentioned objects.

In a first aspect thereof the present invention relates, therefore, to a cooling apparatus comprising:

- a casing comprising side walls which houses at least one compartment for the storage of products to be cooled;
- one or more tubes and/or wires arranged between said casing and said at least one compartment;
- a connecting element for securing said one or more tubes and/or wires to a wall of said at least one compartment, said connecting element comprising a base portion apt to be connected to said wall of said at least one compartment and a supporting portion for supporting said one or more tubes and/or wires, wherein said supporting portion comprises a first arm protruding from said base portion and a second arm protruding from said base portion, said first and second arms defining a seat apt to receive a plurality of said tubes and/or wires and wherein said supporting portion further comprises at least one traverse member protruding from said first arm and/or said second arm towards said receiving seat, said at least one traverse member being at least partially elastic and apt to contact at least one of said plurality of said tubes and/or wires which is inserted into said seat and securing it into said seat.

Preferably, the first arm is at least partially elastic and/or the second arm is at least partially elastic.

In a preferred embodiment of the invention, the connecting element further comprises a spring member associated to the first arm or the second arm apt to apply a restoring force opposite to the direction of motion of said first arm or of said second arm when tubes and/or wires are inserted into the seat.

According to a preferred embodiment of the invention, the spring member comprises an elastic rib connecting the base portion to the first arm or the second arm.

Preferably, the connecting element further comprises an anti-slipping element apt to contact at least one of said plurality of said tubes and/or wires which is inserted into the seat and apt to prevent slipping movement thereof.

In a preferred embodiment of the invention, the at least one traverse member comprises an anti-slipping element apt to contact at least one of said plurality of said tubes and/or wires which is inserted into said seat and apt to prevent slipping movement thereof.

Preferably, the anti-slipping element comprises a portion protruding from said at least one traverse member.

According to a preferred embodiment of the invention, the anti-slipping element is defined by a folded portion of said at least one traverse member.

In a preferred embodiment of the invention, the base portion is connectable to the wall by means of adhesive.

In a further preferred embodiment of the invention, the base portion is connectable to the wall by means of a connecting device.

Preferably, the connecting element is made of plastic, preferably obtained by injection moulding.

BRIEF DESCRIPTION OF THE DRAWINGS

Further characteristics and advantages of the present invention will be highlighted in greater detail in the following detailed description of preferred embodiments of the invention, provided with reference to the enclosed drawings. In the drawings, corresponding characteristics and/or components are identified by the same reference numbers. In such drawings:

FIG. 12 shows another preferred embodiment of the connecting element of FIG. 6.

FIG. 13 shows a sectioned view of the connecting element of FIG. 12.

FIG. 14 shows a plan frontal view of the connecting element of FIG. 12.

FIG. 17 shows another preferred embodiment of the connecting element of FIG. 6.

FIG. 18 shows a sectioned view of the connecting element of FIG. 17.

FIG. 19 shows a plan frontal view of the connecting element of FIG. 17.

DETAILED DESCRIPTION OF THE INVENTION

The present invention has proved to be particularly advantageous when applied to a compartment for storing the articles to be kept cool, like for example vegetables, fruit, dairy products, meat, beverages in bottles or cans, of a refrigerator, as described below.

It should in any case be underlined that the present invention is not limited to this type of application. On the contrary, the present invention generally relates to cooling apparatuses, i.e. refrigerators and/or freezers with one or more compartments for storing the articles.

Figure 1:
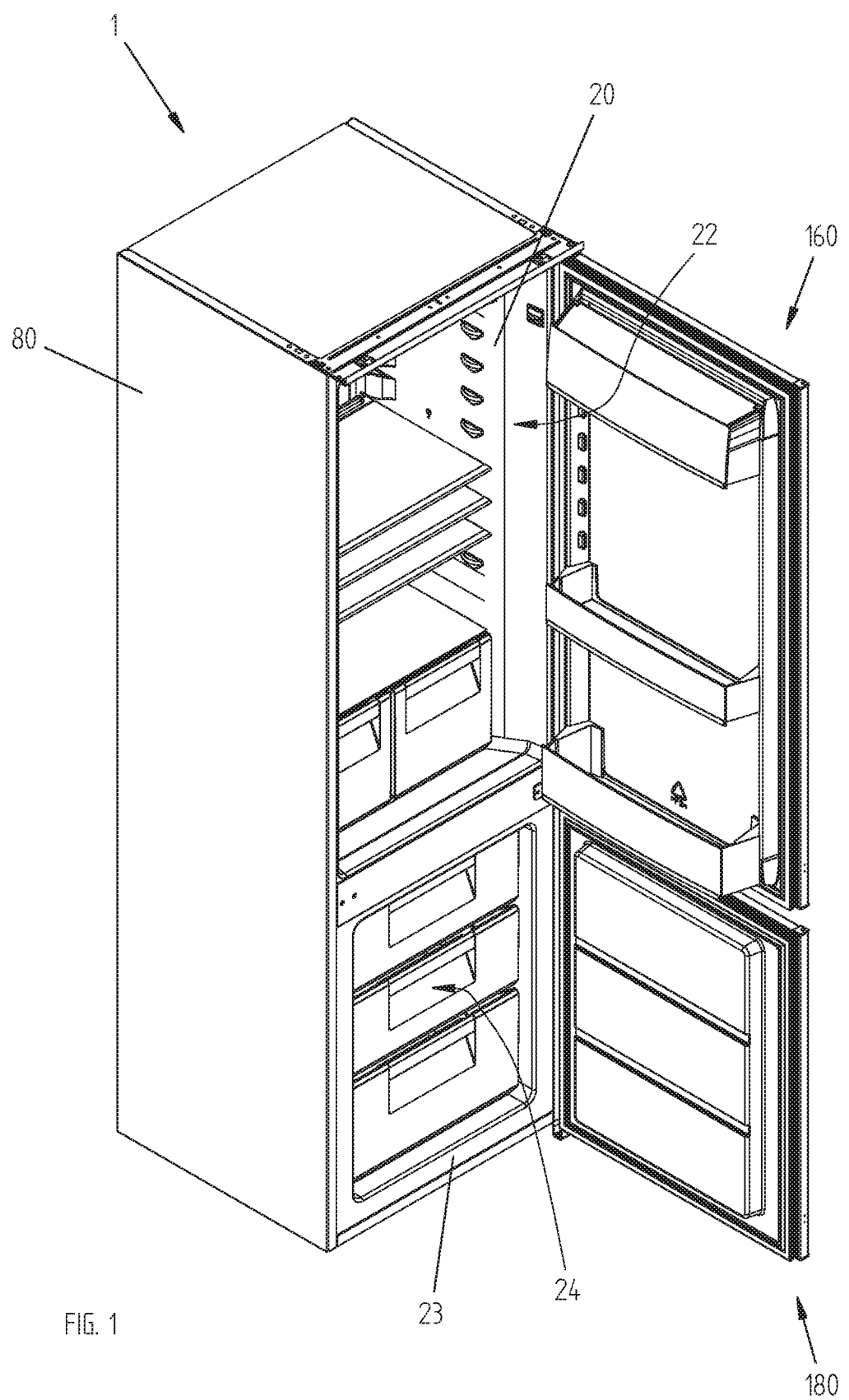
FIG. 1 shows a perspective view of a cooling apparatus according to an embodiment of the present invention.

FIG. 1 shows a cooling apparatus 1, also typically known as refrigerator, according to a preferred embodiment of the invention.

The cooling apparatus 1 preferably comprises an outer casing 80, or cabinet, comprising side walls which houses inner casings 20, 23.

The first inner casing 20 preferably defines a refrigerator compartment 22 and the second inner casing 23 preferably defines a freezer compartment 24 and refers therefore to a refrigerator with combined solution.

Inner casings 20, 23 are also indicated with the term "inner liners".

The cooling apparatus 1 illustrated and described herein is a built-in type cooling apparatus 1 that is apt to be installed within a containment structure, not illustrated, like for example a kitchen cabinet. The cooling apparatus 1 is preferably secured to the structure by means of suitable connecting devices (not shown).

The cooling apparatus 1 further preferably comprises an upper door 160 associated with the refrigerated compartment 22 and a lower door 180 associated with the freezer compartment 24. In a variant embodiment, a single door may be provided for closing both compartments.

In different embodiments, not illustrated, the cooling apparatus may preferably comprise a different number and/or combination of refrigerator and/or freezer compartments, possibly even only one refrigerator or freezer compartment.

The number and/or shape and/or position of the refrigerator or freezer compartments mainly depend on the model of refrigerator eventually produced and marketed by the producer.

Refrigerator compartment 22 and freezer compartment 24 are preferably made of a polymeric plastic material, such as PS polystyrene.

In the preferred embodiment illustrated, the two compartments 22, 24 are two separate elements, i.e. defined by two respective independent inner casings 20, 23. In different embodiments, not illustrated, the two compartments may be formed as a one-piece monolithic body, i.e. a single inner casing (or inner liner).

The refrigerator compartment 22 preferably has a substantially box-like shape comprising a rear wall 22a and a lateral wall 22b.

Analogously, the freezer compartment 24 preferably has a substantially box-like shape comprising a rear wall and a lateral wall, not visible in the Figures.

Figure 2:
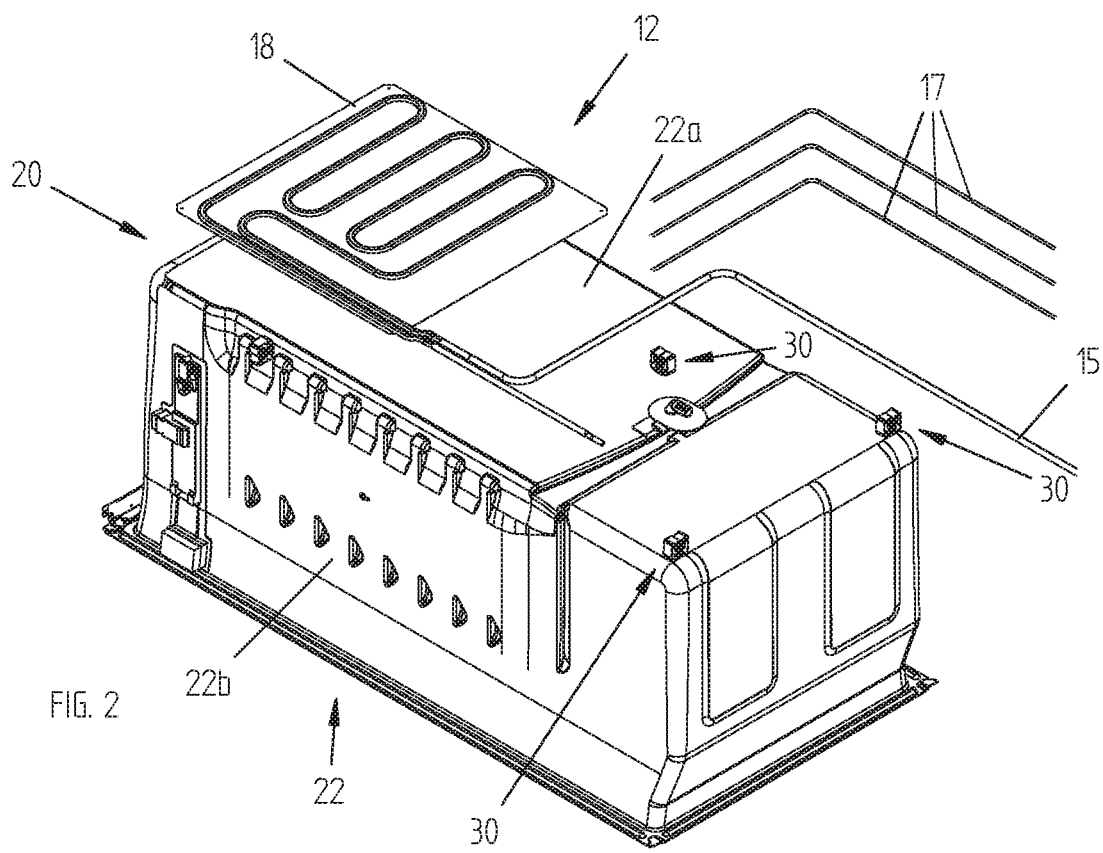
FIG. 2 shows in exploded perspective view some components of the cooling apparatus of FIG. 1 equipped with a plurality of connecting elements according to an embodiment of the present invention.
Figure 3:
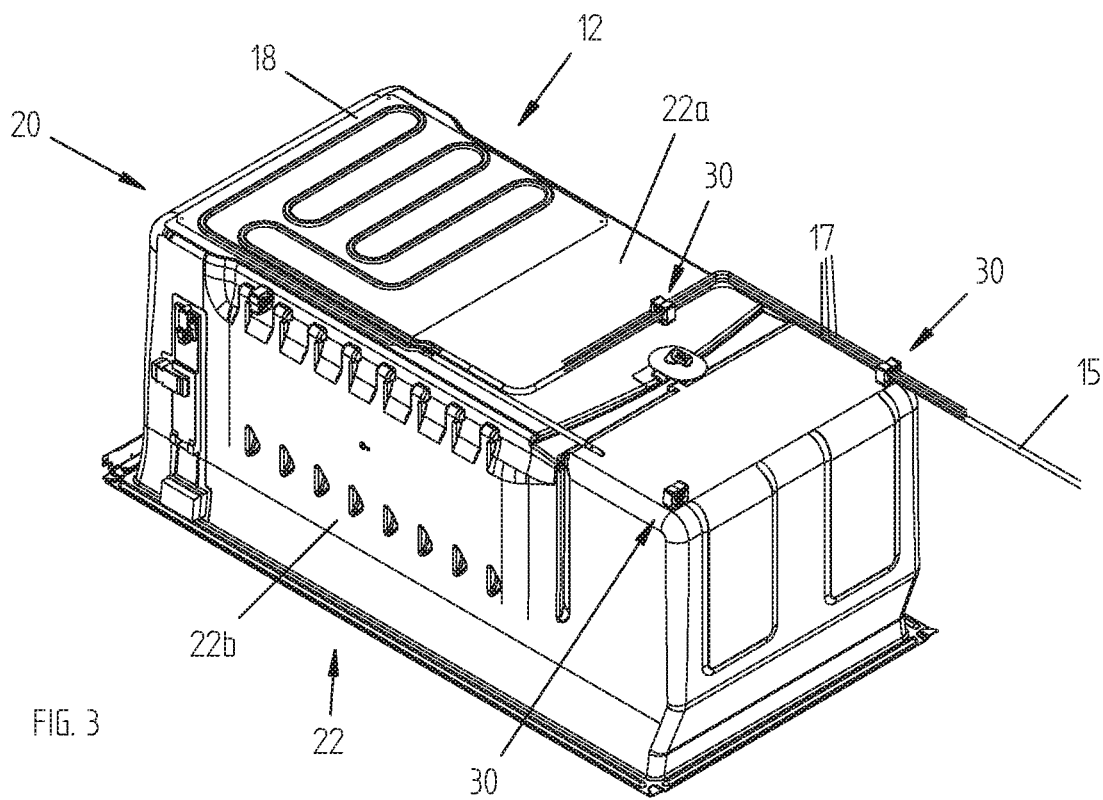
FIG. 3 shows the perspective view of FIG. 2 in assembled configuration.
Figure 4:
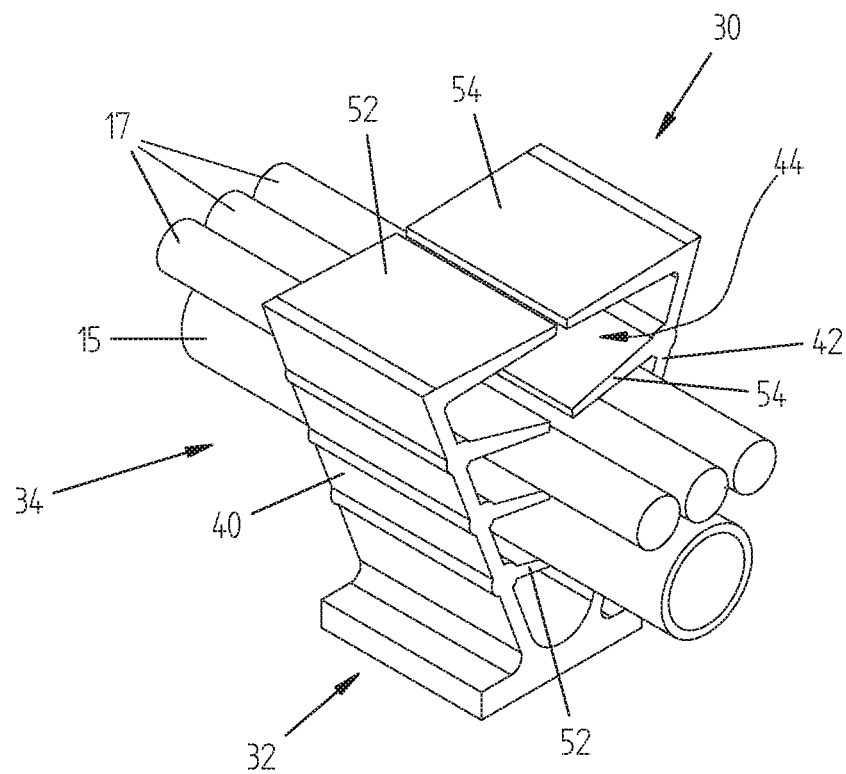
FIG. 4 shows the perspective view of a connecting element of FIG. 2 with tubes/wires received therein.

In FIGS. 2 and 3, only the refrigerator compartment 22 is shown.

It should in any case be underlined that what is described hereinafter for the refrigerator compartment 22 may advantageously apply to the freezer compartment 24.

The figures also show a plurality of connecting elements 30 according to a preferred embodiment of the invention. In the preferred embodiment here illustrated, two connecting elements 30 are advantageously used for securing a tube 15 of an evaporator 12 and some electric wires 17 to the rear wall 22a of the refrigerator compartment 22.

The evaporator 12 is preferably connected to the rear wall 22a of the refrigerator compartment 22 by means of a supporting panel 18. The evaporator 12 is preferably glued to the supporting panel 18. The supporting panel 18 is preferably made with a thermal conducting material, preferably made with aluminium.

Electric wires 17 may be preferably used, for example, to supply voltage to a lamp inside the compartment or to power a compressor, a control unit, a thermostat, etc.

According to an aspect of the present invention, the connecting element 30 secures the tube 15 and the electric wires 17 to the refrigerator compartment 22, preferably, but not necessarily, to the rear wall 22a of the refrigerator compartment 22.

Preferably, each connecting element 30 secures both the tube 15 and the electric wires 17 at a predetermined point of the rear wall 22a of the refrigerator compartment 22, as illustrated in FIG. 3.

In an alternative advantageous version, not illustrated, some connecting elements 30 can secure only tube 15, and/or some connecting elements 30 can secure only electric wires 17, and, optionally, some other connecting elements 30 secure both tube 15 and electric wires 17.

A connecting element 30, as illustrated in FIGS. 4 to 7, preferably comprises a base portion 32 adapted to be connected to the refrigerator compartment 22, preferably to the rear wall 22a of the refrigerator compartment 22, and a supporting portion 34 for supporting the tube 15 and the electric wires 17.

According to the preferred embodiment illustrated herein, the base portion 32 preferably comprises a, preferably parallelepiped plate, portion which is preferably connected to the refrigerator compartment 22 by means of an adhesive, preferably a glue or a bi-adhesive tape.

Figure 20:
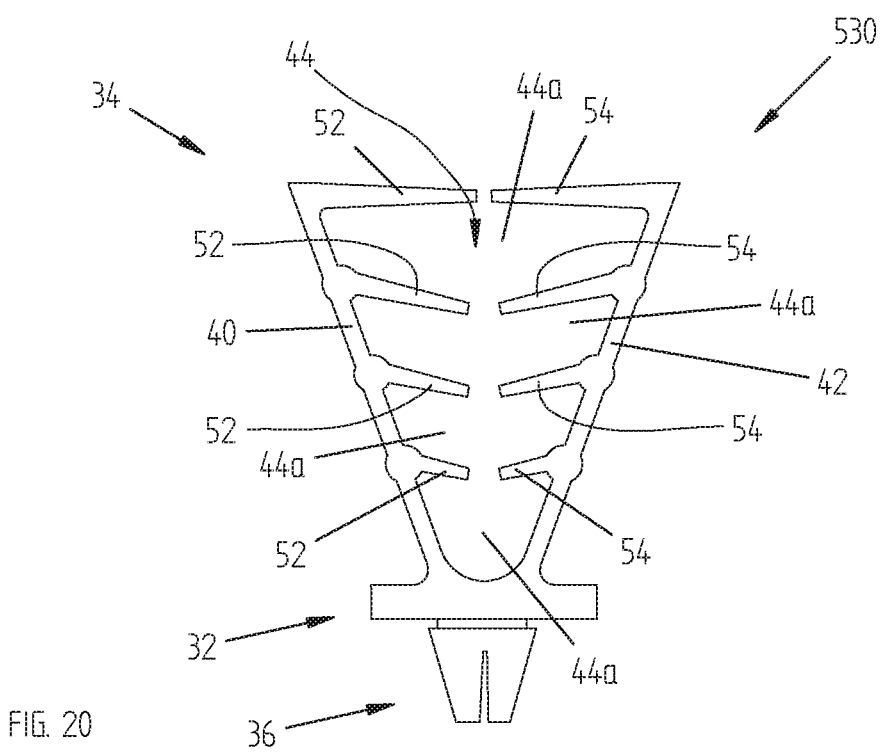
FIG. 20 shows another preferred embodiment of the connecting element of FIG. 7.

In different embodiments, the base portion 32 may preferably comprise a connecting device, as illustrated for example in the embodiment of FIG. 20 wherein the connecting device is indicated with reference number 36.

The connecting device 36 preferably comprises a pin, which can be inserted into a hole defined in the refrigerator compartment 22.

In different advantageous embodiments, the connecting device may be differently realized.

According to an aspect of the present invention, the supporting portion 34 preferably comprises a first arm 40 protruding from the base portion 32 and a second arm 42 protruding from the base portion 32.

The first and second arms 40, 42 define a seat 44 adapted to receive a plurality of tubes and/or wires, particularly adapted to receive the tube 15 and the electric wires 17.

At least one, preferably both, between the first arm 40 and the second arm 42 is preferably at least partially elastic.

The at least partially elastic arm 40, 42, both of them if both are at least partially elastic, can therefore advantageously deform and move away from the other arm when tubes and/or wires 15, 17 are inserted into the seat 44.

Preferably, the arms 40, 42 longitudinally protrude from the base portion 32 along two respective directions so as to define a V-shape configuration; in this case the seat 44 has preferably a substantially triangular shape.

According to an aspect of the present invention, the supporting portion 34 further preferably comprises at least one traverse member that protrudes from one between the first arm 40 and the second arm 42 towards the seat 44.

In the preferred embodiment illustrated in FIGS. 4-7, the supporting portion 34 preferably comprises four traverse members 52 protruding from the first arm 40 and four traverse members 54 protruding from the second arm 42.

Figure 5:
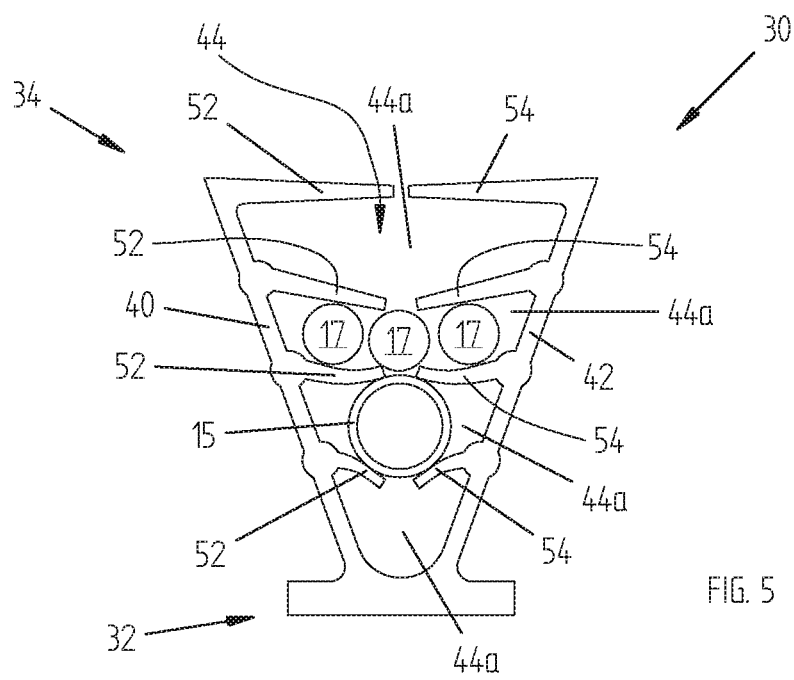
FIG. 5 shows a plan frontal view of the connecting element of FIG. 4.
Figure 6:
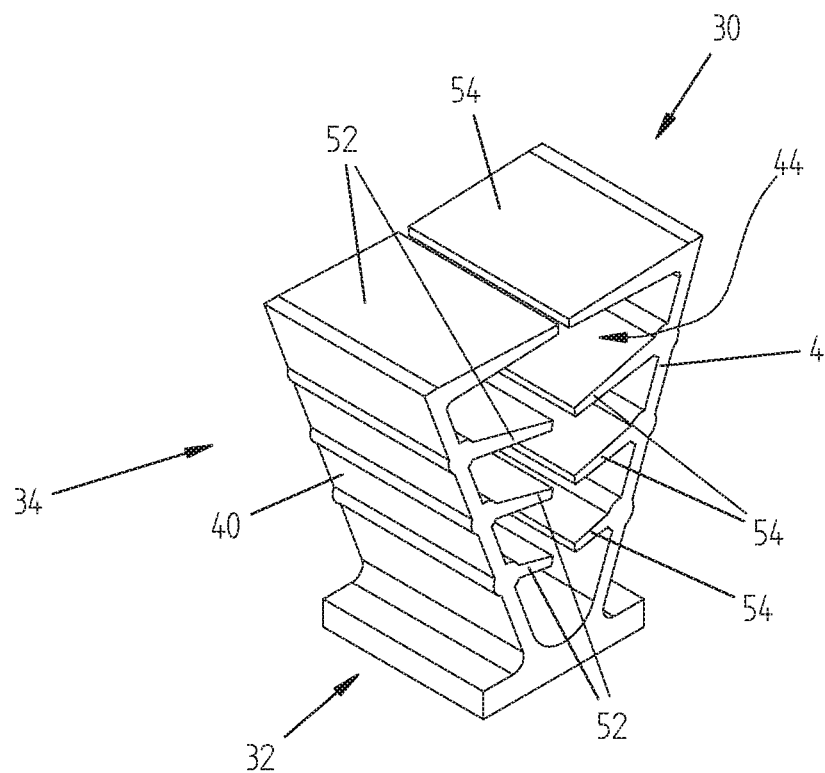
FIG. 6 shows the connecting element of FIG. 4 with tubes/wires removed therefrom.
Figure 7:
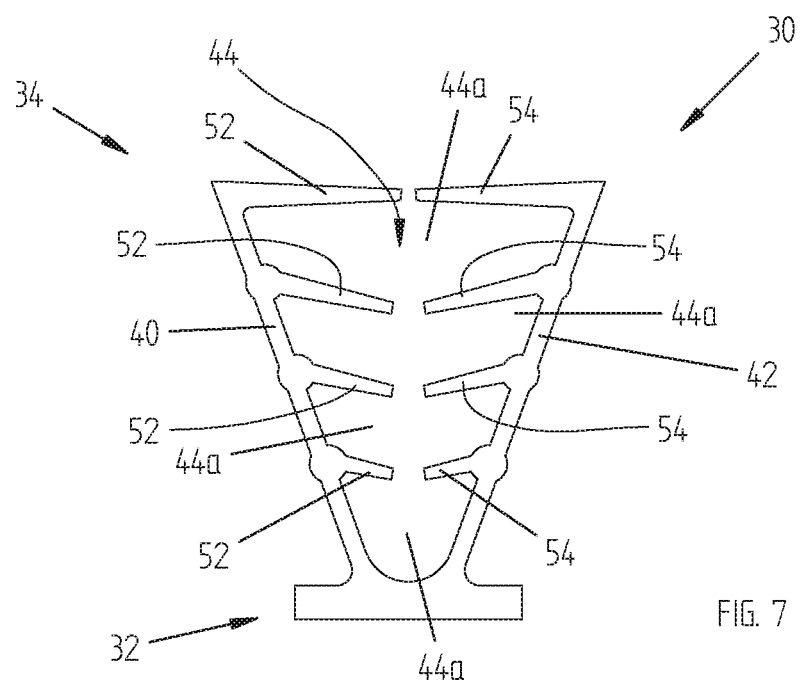
FIG. 7 shows a plan frontal view of the connecting element of FIG. 6.

According to an advantageous aspect of the present invention, the traverse members 52, 54 are at least partially elastic and adapted to contact tubes and/or wires 15, 17 which are inserted into the seat 44, as better visible in FIG. 5.

The, preferably four, traverse members 52 protruding from the first arm 40 and the four traverse members 54 protruding from the second arm 42 are preferably symmetrically arranged. The traverse members 52 protruding from the first arm 40 and the traverse members 54 protruding from the second arm 42 preferably face each other in couples.

The traverse members 52, 54 are preferably arranged so that the seat 44 is divided into sectors or compartments 44a wherein one or more tubes and/or wires 15, 17 are received.

Advantageously, the connecting element 30 according to the invention allows to receive a plurality of tubes and/or wires 15, 17 which are inserted therein.

The elastic traverse members 52, 54 advantageously deform when the tubes and/or wires 15, 17 are inserted into the seat 44 and are accommodated into a respective compartment 44a. The elastic traverse members 52, 54 then advantageously abut against the tubes and/or wires 15, 17, holding them in place.

Advantageously, the connecting element 30 may receive into its seat 44 tubes and/or wires 15, 17 having different sizes or diameters, since the elastic traverse members 52, 54 deform to fit the different sizes.

Advantageously, a plurality of connecting elements 30 of the same type may be arranged in different points of the inner liner where the tubes and/or wires need to be supported.

This advantageously reduces time and/or manufacturing costs of the refrigerator.

Furthermore, the connecting element according to the invention shows reduced size compared to connecting elements of known type adapted to support a plurality of tubes and/or wires.

Figure 8:
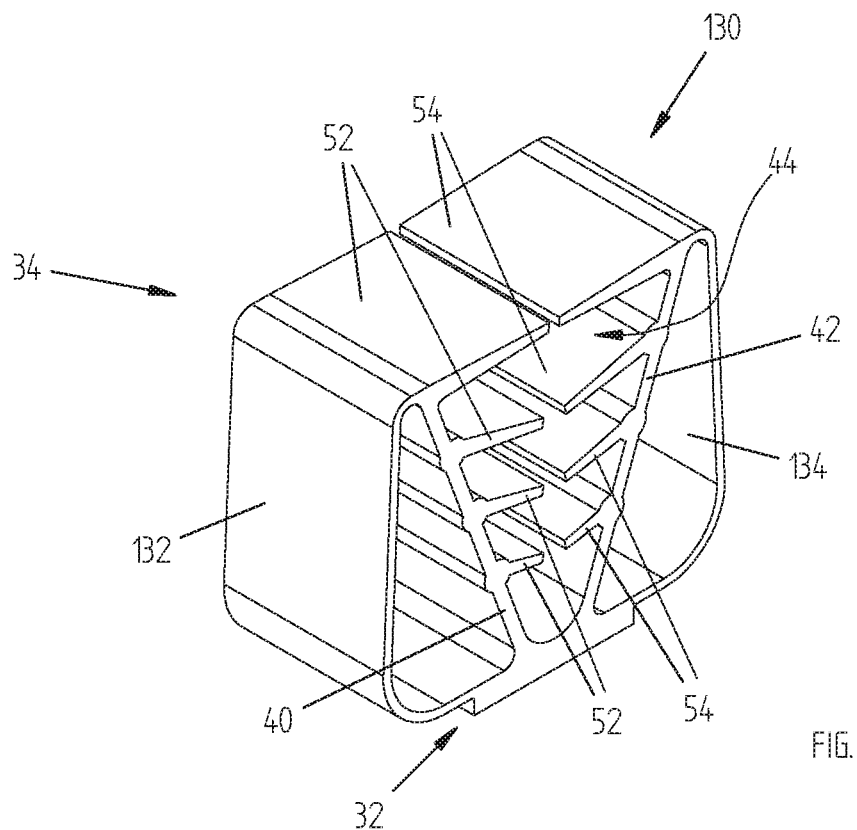
FIG. 8 shows another preferred embodiment of the connecting element of FIG. 6.
Figure 9:
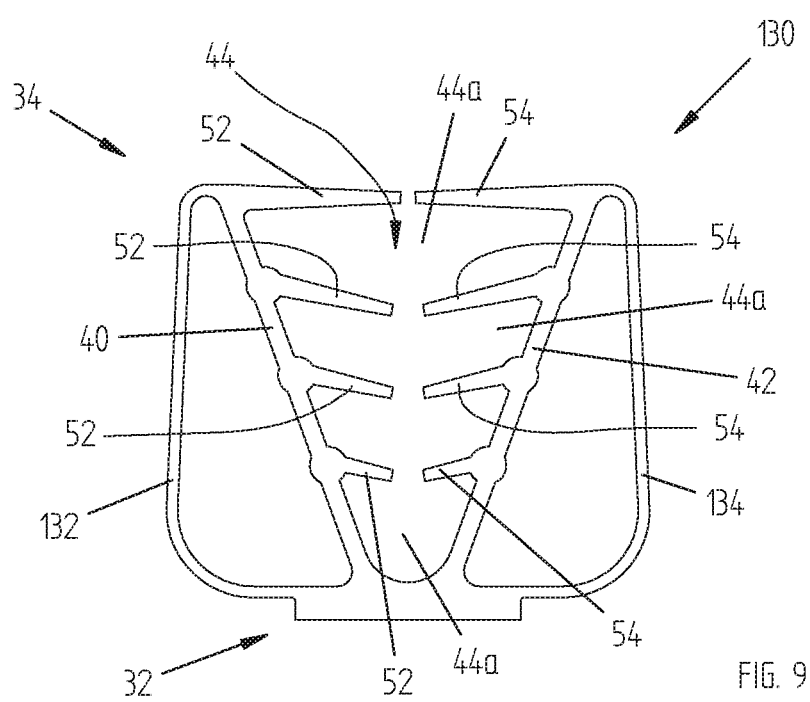
FIG. 9 shows a plan frontal view of the connecting element of FIG. 8.

With reference to FIGS. 8 and 9, a connecting element 130 according to a further preferred embodiment of the invention is described.

The connecting element 130 differs from the connecting element 30 previously described with reference to FIGS. 2 to 7 in that it further comprises a first spring member 132 associated to the first arm 40 and, preferably, also a second spring member 134 associated to the second arm 42.

The connecting element 130 refers to a preferred embodiment wherein the first arm 40 is at least partially elastic and the second arm 42 is at least partially elastic. As said above, the arms 40, 42 can therefore advantageously deform and move away when tubes and/or wires 15, 17 are inserted into the seat 44.

The spring members 132, 134 apply a restoring force opposite to the direction of motion of the first arm 40 and the second arm 42 when they deform and move away when tubes and/or wires 15, 17 are inserted into the seat 44. The restoring force of the spring members 132, 134 helps to keep the tubes and/or wires 15, 17 firmly in place.

The first spring member 132 preferably comprises an elastic rib that connects the base portion 32 to the first arm 40, preferably the upper end of the first arm 40.

Analogously, the second spring member 134 comprises an elastic rib that connects the base portion 32 to the second arm 40, preferably the upper end of the second arm 42.

Figure 10:
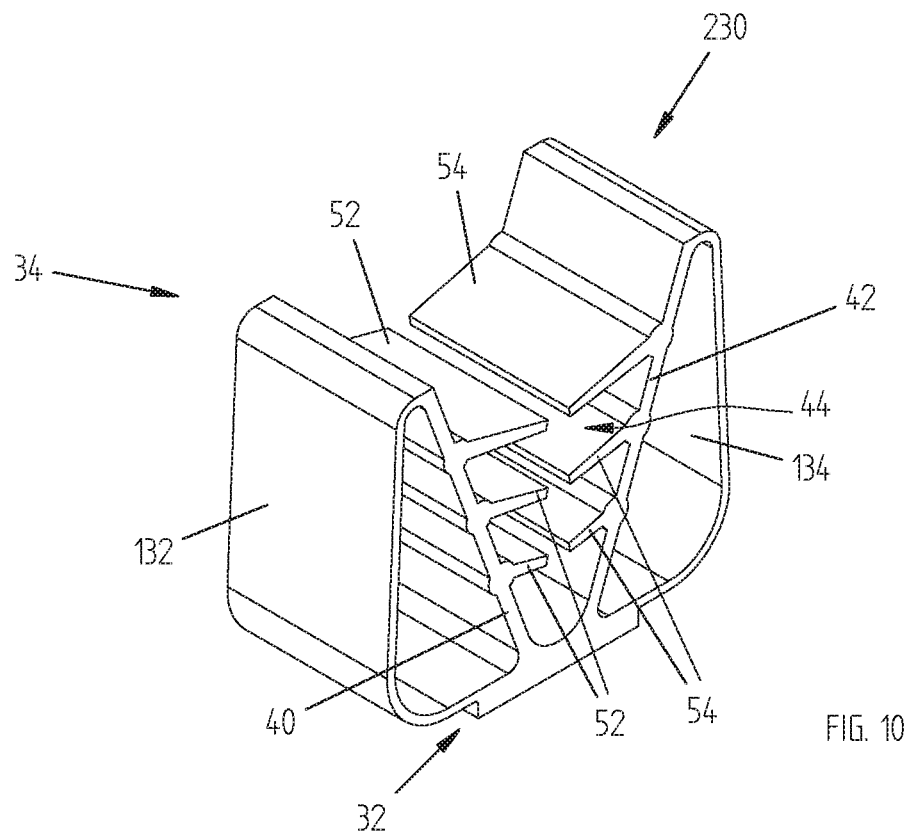
FIG. 10 shows another preferred embodiment of the connecting element of FIG. 6.
Figure 11:
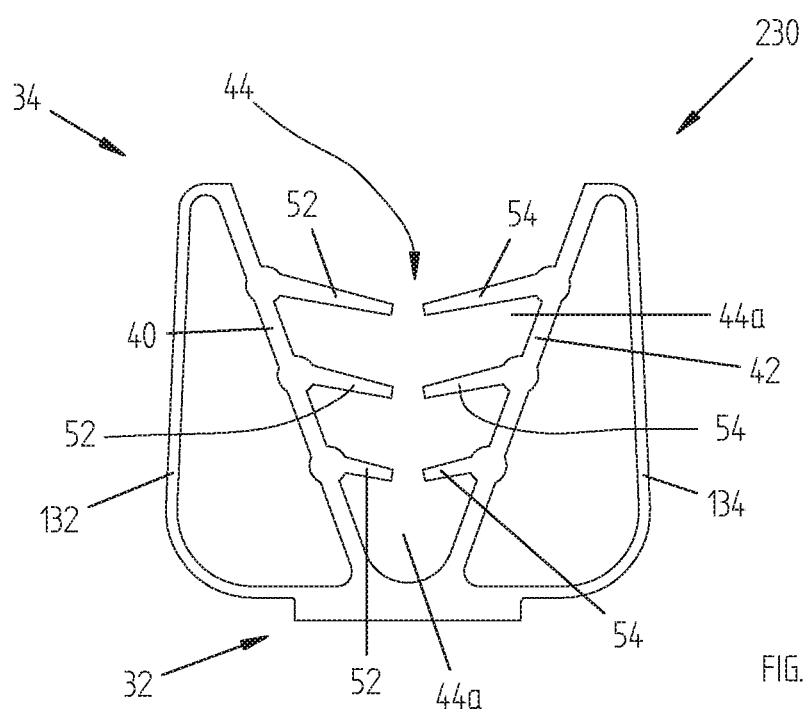
FIG. 11 shows a plan frontal view of the connecting element of FIG. 10.

With reference to FIGS. 10 and 11 a connecting element 230 according to a further preferred embodiment of the invention is described.

The connecting element 230 differs from the connecting element 130 previously described with reference to FIGS. 8 and 9, only in that the two upper elastic traverse members 52, 54 are omitted.

With reference to FIGS. 12 to 16 a connecting element 330 according to a further preferred embodiment of the invention is described.

The connecting element 330 differs from the connecting element 130 previously described with reference to FIGS. 8 and 9 in that it further comprises anti-slipping elements 360.

Figure 15:
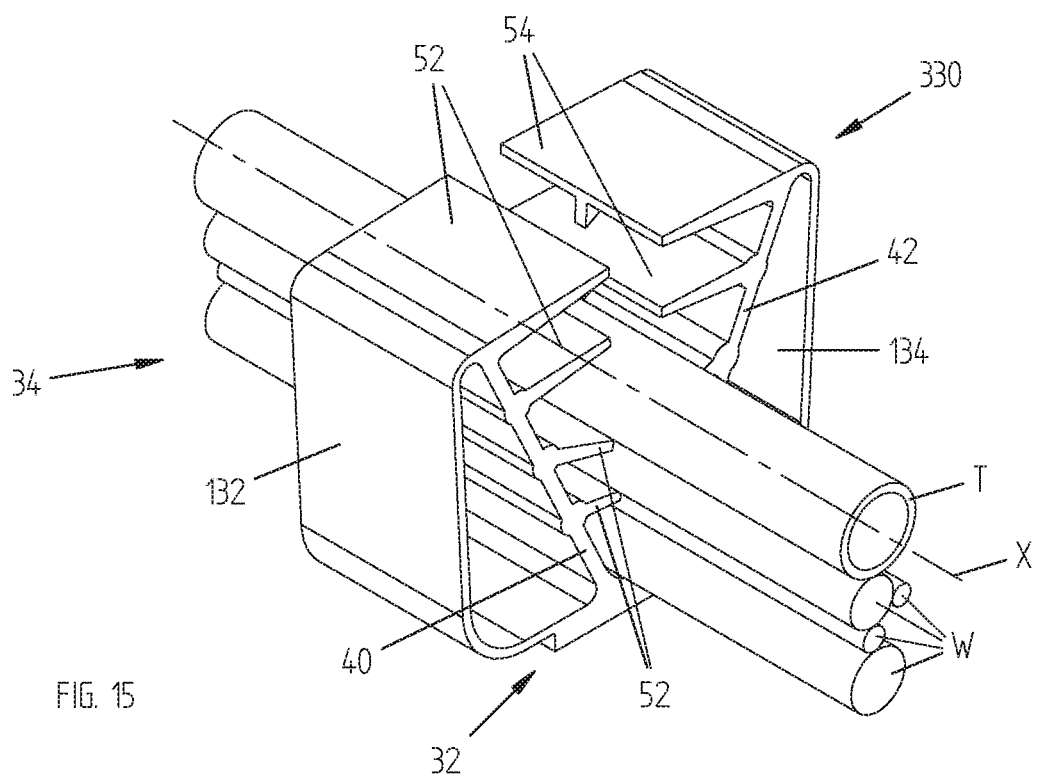
FIG. 15 shows the connecting element of FIG. 12 with tubes/wires received therein.
Figure 16:
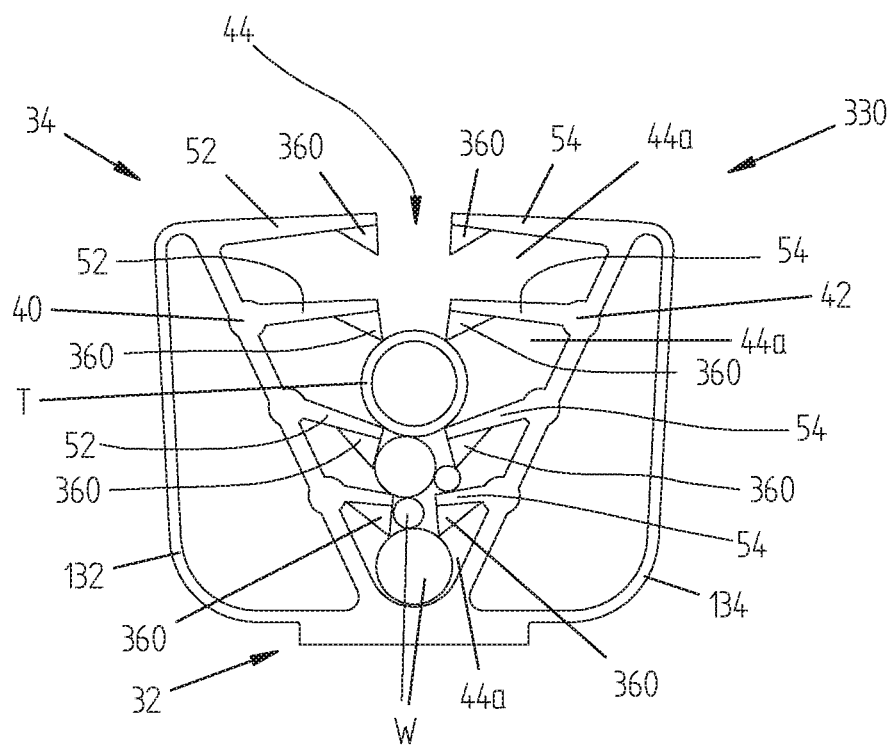
FIG. 16 shows a plan frontal view of the connecting element of FIG. 15.

In particular, preferably, the traverse members 52, 54 comprise anti-slipping elements 360 apt to contact tubes T and/or wires W which are inserted into the compartments 44a, as illustrated in FIGS. 15 and 16.

Preferably, the anti-slipping elements 360 comprise portions protruding from the traverse members 52, 54, more preferably centrally protruding from free ends of the traverse members 52, 54.

Advantageously, the anti-slipping elements 360 are apt to prevent slipping movement of the tubes T and/or wires W along a longitudinal direction X, i.e. preferably the direction along with the tubes T and/or the wires W extend.

Advantageously, anti-slipping elements 360 further help to keep the tubes and/or wires T, W firmly in place.

Preferably, the anti-slipping elements 360 are at least partially elastic and are preferably integrally made with the traverse members 52, 54.

With reference to FIGS. 17 to 19 a connecting element 430 according to a further preferred embodiment of the invention is described.

The connecting element 430 differs from the connecting element 330 previously described with reference to FIGS. 12 to 16 in that it comprises anti-slipping elements 460 of different type.

In particular, preferably, the traverse members 52, 54 comprise anti-slipping elements 460 apt to contact tubes T and/or wires W which are inserted into the compartments 44a.

Preferably, the anti-slipping elements 460 comprise portions protruding from the traverse members 52, 54. Preferably, the protruding portions are defined by folded portions 460 of the traverse members 52, 54, more preferably by folded corners 460 of the traverse members 52, 54.

Preferably, each traverse member 52, 54 comprises both a folded portion 460 which faces a lower compartment 40a and a folded portion 460 which faces an upper compartment 40a.

Advantageously, anti-slipping elements 460 further help to keep the tubes and/or wires firmly in place.

Preferably, the anti-slipping elements 460 are at least partially elastic and are preferably integrally made with the traverse members 52, 54.

Preferably, the connecting elements above described are made of plastic, preferably made of PS (polystyrene) more preferably obtained by injection moulding It has thus been shown that the present invention allows all the set objects to be achieved. In particular, it makes it possible to provide a cooling apparatus that makes it possible to reduce its complexity, and therefore easier to assemble, compared to cooling apparatuses of known type.

It is underlined that the connecting elements illustrated in the enclosed figures are connected to the rear side of the compartment; however it is clear that connecting elements according to the invention can be connected to any other wall of the compartment to secure tubes and/or wire thereto.

The present invention has been here described in some of its possible embodiments, however those skilled in the art will recognize that several modifications to the described embodiments can be made, as well as other embodiments are possible, without departing from the protection scope defined in the appended claims.

The invention claimed is:

1. A refrigerator and/or freezer comprising:
   an outer casing configured to house at least one compartment of the refrigerator and/or freezer for the storage of products to be cooled;
   one or more tubes and/or wires arranged between the outer casing and the at least one compartment;
   a connecting element arranged to support the one or more tubes and/or wires within a space located between the outer casing and the at least one compartment of the refrigerator and/or freezer, the connecting element comprising a base portion configured to be connected to the wall of the at least one compartment and a supporting portion for supporting the one or more tubes and/or wires, wherein an insulating foam is filled in the space to secure and insulate the one or more tubes and/or wires within the space,
   wherein the supporting portion comprises a first arm protruding from the base portion and a second arm protruding from the base portion, the first arm and the second arm defining a seat configured to receive a plurality of the one or more tubes and/or wires and wherein the supporting portion further comprises a plurality of traverse members symmetrically arranged and protruding from each of the first arm and the second arm towards the seat, the plurality of traverse members being at least partially elastic and configured to contact at least one of the plurality of the one or more tubes and/or wires which is inserted into the seat and securing it into the seat,
   wherein each protruded end of a traverse member of the first arm faces a protruded end of a traverse member of the second arm.

2. The refrigerator and/or freezer of claim 1, wherein the first arm is at least partially elastic and/or the second arm is at least partially elastic.

3. The refrigerator and/or freezer of claim 1, wherein the connecting element further comprises a spring member associated with the first arm or the second arm, the spring member being configured to apply a restoring force opposite to a direction of motion of the first arm or of the second arm when the one or more tubes and/or wires are inserted into the seat.

4. The refrigerator and/or freezer of claim 3, wherein the spring member comprises an elastic rib connecting the base portion to the first arm or the second arm.

5. The refrigerator and/or freezer of claim 1, wherein the connecting element further comprises an anti-slipping element configured to contact and prevent slipping movement of at least one of the plurality of the one or more tubes and/or wires which is inserted into the seat.

6. The refrigerator and/or freezer of claim 1, wherein the plurality of traverse members comprise an anti-slipping element configured to contact and prevent slipping movement of at least one of the plurality of the one or more tubes and/or wires which is inserted into the seat.

7. The refrigerator and/or freezer of claim 6, wherein the anti-slipping element comprises a portion protruding from the plurality of traverse members.

8. The refrigerator and/or freezer of claim 6, wherein the anti-slipping element is defined by a folded portion of the plurality of traverse members.

9. The refrigerator and/or freezer of claim 1, wherein the base portion is connectable to the wall by means of adhesive.

10. The refrigerator and/or freezer of claim 1, wherein the base portion is connectable to the wall by means of a connecting device.

11. The refrigerator and/or freezer of claim 1, wherein the connecting element is made of plastic.

12. The refrigerator and/or freezer of claim 11, wherein the connecting element comprises an injection molded plastic.

13. The refrigerator and/or freezer of claim 1, wherein the first arm and the second arm protrude from the base portion at diverging angles, and each of the first arm and the second arm comprises a respective plurality of traverse members, each respective plurality of traverse members comprising:
a first traverse member having a first length; and
a second traverse member having a second length, the second traverse member being located further from the base portion than the first traverse member, and the second length being greater than the first length.

14. The refrigerator and/or freezer of claim 13, wherein the respective traverse members of the first arm are configured as a mirror image of the respective traverse members of the second arm with respect to a plane extending perpendicular to the base portion.

* * * * *